United States Patent [19]

Hasegawa

[11] Patent Number: 5,545,969
[45] Date of Patent: Aug. 13, 1996

[54] BATTERY RESIDUAL CAPACITY DISPLAYING SYSTEM WITH DISCHARGED ELECTRICAL QUANTITY COMPUTATION SECTION

[75] Inventor: Hirokazu Hasegawa, Fujisawa, Japan

[73] Assignee: Matsushita Electric Industrial Co., Ltd., Osaka, Japan

[21] Appl. No.: 140,501

[22] Filed: Oct. 25, 1993

[30] Foreign Application Priority Data

Dec. 2, 1992 [JP] Japan ................................ 4-322968
Dec. 2, 1992 [JP] Japan ................................ 322969
Dec. 2, 1992 [JP] Japan ................................ 4-322970

[51] Int. Cl.⁶ .................................................. H01M 10/48
[52] U.S. Cl. .............................. 320/5; 320/35; 320/39; 320/48; 324/427; 340/636
[58] Field of Search ............................... 320/5, 31, 32, 320/35, 37, 39, 48; 324/426, 431, 433, 435; 340/635, 636

[56] References Cited

U.S. PATENT DOCUMENTS 4,377,787  3/1983  Kikuoka et al. .
4,390,841  6/1983  Martin et al. .
4,743,831  5/1988  Young .
4,949,046  8/1990  Seyfang ................................ 324/427
5,047,961  9/1991  Simonsen ............................ 320/48 X

FOREIGN PATENT DOCUMENTS

0225106A1  6/1987  European Pat. Off. .
2148518A   5/1985  United Kingdom .

*Primary Examiner*—Peter S. Wong
*Assistant Examiner*—Edward Tso
*Attorney, Agent, or Firm*—Watson Cole; Stevens Davis, P.L.L.C.

[57] ABSTRACT

A system for displaying the residual capacity of a secondary battery so as to update the battery capacity when the battery discharges from its full charged condition to a predetermined voltage level, in which this predetermined voltage is selected to be sufficiently higher than the operation halting voltage of a portable electrical apparatus to be connected, and the quantity of electricity discharged until the predetermined voltage level is reached is suitably corrected to determine the newest battery capacity, so that the battery capacity can be accurately updated under the actual operating condition with a high frequency and high precision.

7 Claims, 7 Drawing Sheets

BATTERY RESIDUAL CAPACITY DISPLAYING SYSTEM WITH DISCHARGED ELECTRICAL QUANTITY COMPUTATION SECTION

BACKGROUND OF THE INVENTION

1. Field of the Invention

This invention relates to a system for displaying the residual capacity of a secondary battery widely used as a power source for portable electrical apparatuses and also for generating an alarm signal when the residual capacity of the battery becomes smaller than a predetermined setting.

2. Description of the Prior Art

Prior art systems for displaying the residual capacity of a battery are of a battery voltage detection type which is advantageous from the aspect of cost, an electrical quantity integration type which ensures a highly precise display, etc. Such a system is disclosed in, for example, U.S. Pat. No. 4,377,787 and is mostly built in a portable electrical apparatus or a battery pack.

A prior art residual capacity displaying system of the electrical quantity integration type will now be described by reference to the accompanying drawings.

Figure 7:
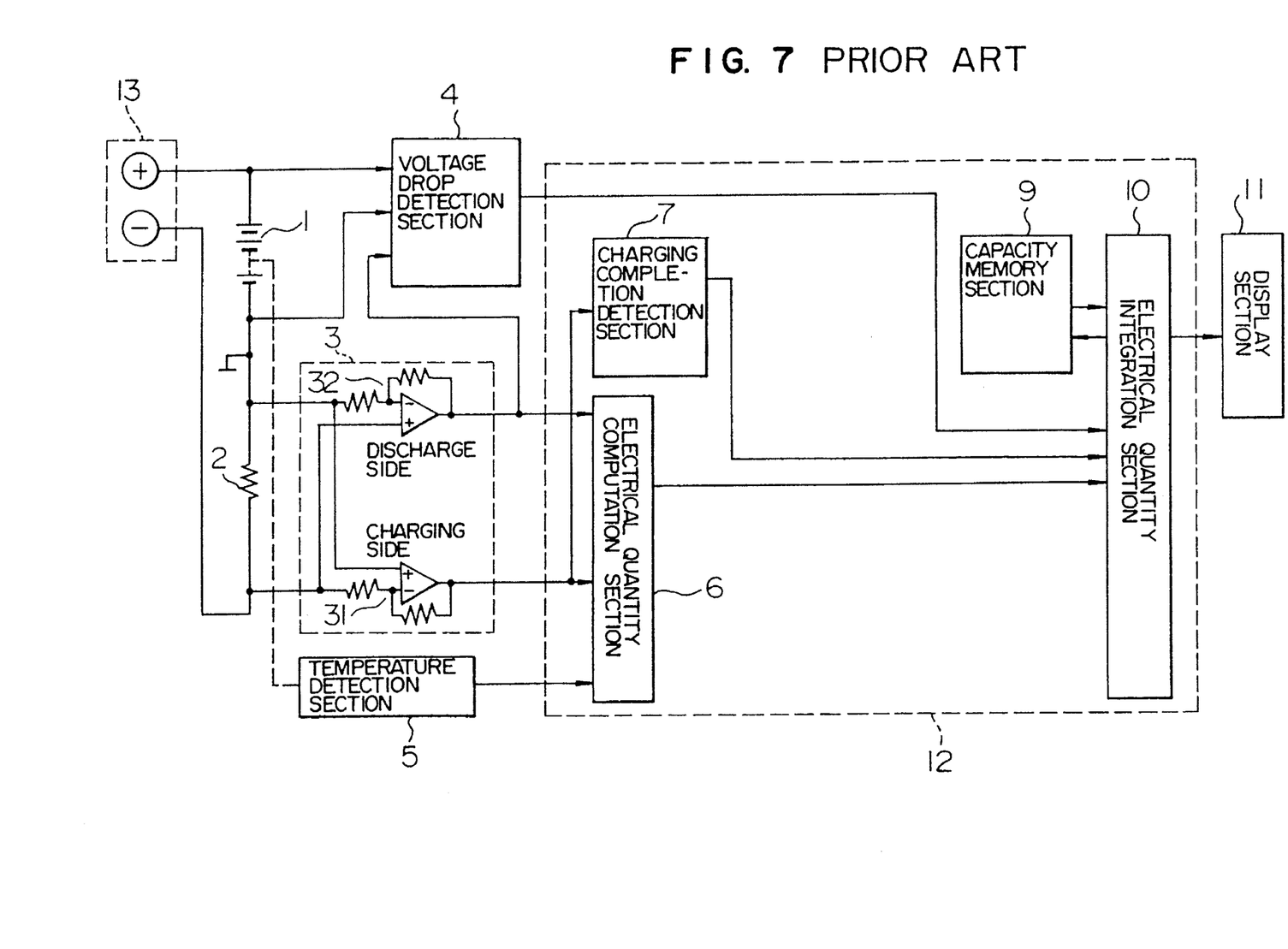
FIG. 7 is a block diagram showing the structure of a prior art battery residual capacity displaying system.

FIG. 7 shows the structure of such a prior art residual capacity displaying system. Referring to FIG. 7, the reference numeral 1 designates a secondary battery, and a current detection resistor 2 is connected at one end to the negative terminal of the secondary battery 1. A charging and discharge current detection section 3 is composed of a charging current detection operational amplifier 31 and a discharge current detection operational amplifier 32 to each of which a very small voltage appearing across the current detection resistor 2 is applied as its input. A voltage drop detection section 4 receives the terminal voltage of the secondary battery 1 as its input. A temperature detection section 5 detects the ambient temperature of the secondary battery 1. An electrical quantity computation section 6 receives the output signals of the operational amplifiers 31, 32 and the output signal of the temperature detection section 5 as its inputs. A charging completion detection section 7 receives the output signal of the operational amplifier 31 as its input. A capacity memory section 9 receives, as its input, an output signal of an electrical quantity integration section 10 which will be described now. This electrical quantity integration section 10 receives the output signal of the electrical quantity computation section 6, the output signal of the capacity memory section 9, the output signal of the voltage drop detection section 4 and the output signal of the charging completion detection section 7 as its inputs. A display section 11 receives the output signal of the electrical quantity integration section 10 as its input. A one-chip microcomputer 12 constitutes the circuitry of the electrical quantity computation section 6, charging completion detection section 7, capacity memory section 9 and electrical quantity integration section 10. The reference numeral 13 designates a terminal across which a portable electrical apparatus or a battery charger is connected.

The operation of the prior art residual capacity displaying system having the aforementioned structure will now be described.

The operation of the residual capacity displaying system in the charging mode will be first described by reference to FIG. 7. When the charger is connected across the terminal 13 to start charging the secondary battery 1, a negative very small voltage (when the level of the negative electrode of the secondary battery 1 is supposed to be set at a zero potential level) proportional to the charging current appears across the current detection resistor 2. This very small voltage is amplified up to a positive value by the function of the operational amplifier 31, and such an output signal of the operational amplifier 31 is applied to both the electrical quantity computation section 6 and the charging completion detection section 7. The electrical quantity computation section 6 computes the quantity of electricity by multiplying the charging current value outputted from the operational amplifier 31 by a predetermined period. Further, in the electrical quantity computation section 6, the computed quantity of electricity is then multiplied by the charging efficiency determined by both the level of the charging current and the temperature information supplied from the temperature detection section 5, thereby computing the finally charged quantity of electricity and applying such an output signal as an input to the electrical quantity integration section 10. In response to the application of the charging current signal from the operational amplifier 31, the charging completion detection section 7 resets its output. Then, when the charging current value changes from that of quick charging to that of trickle charging as the charging operation proceeds, the charging completion detection section 7 recognizes the end of the charging operation and sets its output. In the electrical quantity integration section 10, the charged electrical quantity signals successively outputted from the electrical quantity computation section 6 are added at time intervals of the predetermined period thereby integrating the quantity of electricity. Thus, the ratio of the integrated value of the quantity of electricity to the capacity value stored in the capacity memory section 9 determines the residual capacity of the secondary battery 1. When the charging completion detection section 7 sets its output, the integrated value of the quantity of electricity at that time is stored in the capacity memory section 9 to update the capacity at the time of the charging operation, so that the residual capacity of the secondary battery 1 is set at 100%.

Figure 3A:
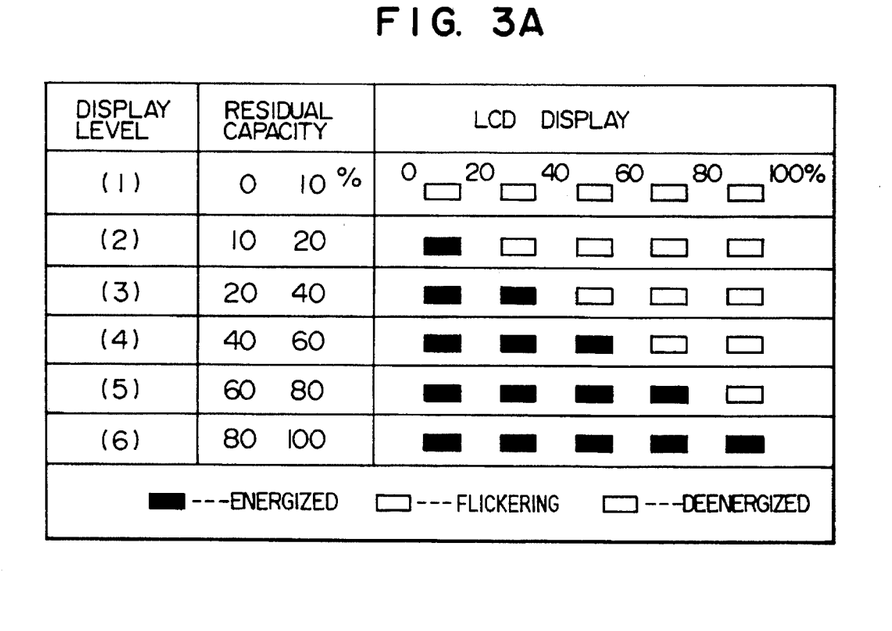
FIG. 3A shows the relation between the residual capacity and the capacity display level in FIG. 1.

On the basis of the residual capacity information determined by the electrical quantity integration section 10, the display section 11 displays the residual capacity stepwise on an LCD display as shown in FIG. 3A. As the secondary battery 1 is progressively charged, the residual capacity is successively displayed in the order of from a display level (1) towards a display level (6) as shown. FIG. 3A shows the relation between the residual capacity of the secondary battery 1 and the display level. The LCD display consists of five LCD segments horizontally arrayed on a line. In the display level (1) which indicates the residual capacity value of 0% to 10%, one LCD segment makes a flickering display. In the display level (2) which indicates the residual capacity value of 10% to 20%, one LCD segment is lit. Similarly, in the display levels (3) to (6) which indicate the residual capacity values of 20% to 40%, 40% to 60%, 60% to 80% and 80% to 100% respectively, two LCD segments, three LCD segments, four LCD segments and five LCD segments are lit respectively as shown. Thus, the residual capacity of the secondary battery 1 is continuously displayed by the lighting of one or more of the linearly arrayed LCD segments.

The operation of the residual capacity displaying system in the discharge mode will next be described. When a portable electrical apparatus to be used is connected across the terminal 13, the current is supplied from the secondary battery 1, and the discharge is started. As a result, a positive very small voltage (when the level of the negative electrode of the secondary battery 1 is supposed to be set at a zero potential level) proportional to the discharge current appears across the current detection resistor 2. This very small voltage is amplified by the operational amplifier 32, and the amplifier output signal is applied as an input to the electrical quantity computation section 6. The electrical quantity computation section 6 computes the quantity of electricity by multiplying the discharge current value outputted from the operational amplifier 32 by a predetermined period. Further, in the electrical quantity computation section 6, the computed quantity of electricity is multiplied by the discharge efficiency determined by both the level of the discharge current and the temperature information supplied from the temperature detection section 5, thereby computing the finally discharged quantity of electricity and applying such an output signal as an input to the electrical quantity integration section 10. The voltage drop detection section 4, which is basically in the form of a voltage comparator, continuously checks the secondary battery 1 for the voltage drop occurring as the discharge proceeds, and the level of the detection voltage is selected to be higher than the operation halting voltage level of the portable electrical apparatus. In the electrical quantity integration section 10, the discharged electrical quantity signals successively outputted from the electrical quantity computation section 6 are subtracted at time intervals of the predetermined period thereby integrating the quantity of electricity. On the basis of the ratio of this integrated value of the quantity of electricity to the value stored in the capacity memory section 9, the value of the residual capacity is determined. When the voltage drop signal is generated from the voltage drop detection section 4, the value stored in the capacity memory section 9 is corrected on the basis of the difference between the integrated value of the quantity of electricity at that time and the zero integrated value, thereby updating the residual capacity in the discharge mode. Then, this integrated value of the quantity of electricity is nullified to set the residual capacity value at 0%. More concretely, when the integrated value of the quantity of electricity at the time of appearance of the voltage drop signal from the voltage drop detection section 4 corresponds to 5% in terms of the residual capacity value, the manner of correction is such that the value stored in the capacity memory section 9 is decreased by the amount of 5%. On the other hand, when the integrated value of the quantity of electricity at the time of appearance of the voltage drop signal is negative due to subtraction and corresponds to −5% in terms of the residual capacity value, the manner of correction is such that the value stored in the capacity memory section 9 is increased by the amount of 5%. The display section 11 displays stepwise the residual capacity on the basis of the residual capacity information determined by the electrical quantity integration section 10, and its display successively shifts from the display level (6) towards the display level (1) shown in FIG. 3A as the discharge proceeds.

The operation of the residual capacity displaying system in the stand-by mode will be finally described. The stand-by mode designates the state where neither the portable electrical apparatus nor the battery charger is connected across the terminal 13 or the state where neither the charging current nor the discharge current is flowing even when the portable electrical apparatus or the charger is actually connected across the terminal 13. Therefore, the stand-by mode is recognized when the electrical quantity computation section 6 detects that both the output signal of the operational amplifier 31 and that of the operational amplifier 32 are null.

The electrical quantity computation section 6 determines the quantity of electricity discharged in the stand-by mode on the basis of the self-discharge quantity of electricity from the secondary battery 1 measured beforehand for each of individual ambient temperatures, the information regarding the electrical quantity consumption of the residual capacity displaying system for the secondary battery 1 and the temperature information supplied by the output signal of the temperature detection section 5. The later operation is the same as that in the discharge mode described already, so that any detailed description will be unnecessary.

It will be seen from the above description that, in the prior art battery residual capacity displaying system of the electrical quantity integration type, the quantity of electricity in the charging mode is corrected on the basis of both the level of the charging current and the detected ambient temperature, while the quantity of electricity in the discharge mode (including the stand-by mode) is corrected on the basis of both the level of the discharge current and the detected ambient temperature. The corrected quantity of electricity is integrated by addition in the charging mode, while the corrected quantity of electricity is integrated by subtraction in the discharge mode, and the integrated value is then compared with the stored value that is the newest capacity value, thereby determining the residual capacity level to be displayed.

Accordingly, in order to improve the precision of display, updating of the stored capacity value so as always to display its accurate value is important. In the prior art system, the stored capacity value is updated when the completion of charging is detected or when the voltage drop is detected. However, when the charging and discharge are repeated several times until the completion of charging is detected or the voltage drop is detected, an error between the integrated value of the quantity of electricity (the displayed value) and the actual value of the residual capacity tends to be increased due to possible errors attributable to the pre-set charging and discharge efficiencies. Thus, the prior art system has had the problem that updating of the stored residual capacity value under such a situation cannot always achieve the desired accurate updating of the residual capacity value, and the precision of display cannot be improved. SUMMARY OF THE INVENTION With a view to solve the prior art problem described above, it is an object of the present invention to provide a battery residual capacity displaying system in which the stored residual capacity value can be accurately updated.

Another object of the present invention is to provide a battery residual capacity displaying system which can display the residual capacity of the battery with a high precision.

In accordance with the present invention which attains the above objects, there is provided a system for displaying the residual capacity of a secondary battery, comprising:

a current detection resistor for converting a charging current and a discharge current of the secondary battery into very small voltages respectively;

a charging and discharge current detection section composed of a charging side operational amplifier and a discharge side operational amplifier for amplifying the very small voltages appearing across the current detection resistor respectively and outputting the resultant signals respectively;

a voltage drop detection section for detecting the situation where the voltage of the secondary battery has dropped to a level lower than a predetermined setting;

a temperature detection section for detecting the ambient temperature of the secondary battery and outputting the resultant signal;

an electrical quantity computation section receiving the charging current detection output signal and the discharge current detection output signal of the charging and discharge current detection section together with the output signal of the temperature detection section as its inputs for deciding whether the operation mode is the charging mode, the discharge mode or the stand-by mode and computing the quantity of electricity in that mode;

a charging completion detection section setting its output signal when completion of charging the secondary battery is detected, but resetting its output signal when charging the secondary battery is started;

a discharged electrical quantity integration section for integrating the discharged quantity of electricity at time intervals of a predetermined period when the output signal of the charging completion detection section is in the set state and the output signal of the electrical quantity computation section indicates the discharge mode, but, when the output signal of the charging completion detection section is in the reset state, nullifying the integrated value irrespective of the output signal of the electrical quantity computation section;

a capacity memory section storing the capacity value integrated by the discharged electrical quantity integration section as a newest battery capacity when the output signal of the charging completion detection section is in the set state and the voltage drop signal is first outputted from the voltage drop detection section after the charging is started;

an electrical quantity integration section for integrating, at time intervals of the predetermined period, the quantity of electricity by addition when the output signal of the electrical quantity computation section represents the electrical quantity in the charging mode, but by subtraction when the output signal of the electrical quantity computation section represents the electrical quantity in the discharge mode, thereby determining the value of the residual capacity on the basis of the ratio of the integrated value of the quantity of electricity to the capacity value stored in the capacity memory section, the electrical quantity integration section setting the integrated value of the quantity of electricity to correspond to the value of the residual capacity at the predetermined voltage level when the voltage drop signal is first outputted from the voltage drop detection section after the charging is started, but setting the integrated value of the quantity of electricity to correspond to the residual capacity of 100% when the output signal of the charging completion detection section is in the set state as a result of the charging; and a display section for displaying the residual capacity stepwise on the basis of the value of the residual capacity determined by the electrical quantity integration section.

The electrical quantity computation section decides whether the operation mode is the charging mode, the discharge mode or the stand-by mode. When the operation mode is decided to be the charging mode or the discharge mode, the charging current output value or the discharge current output value of the charging and discharge current detection section is multiplied by a predetermined period to compute the quantity of electricity, and the computed quantity of electricity is then multiplied by the charging efficiency or the discharge efficiency determined on the basis of both the charging current output value or the discharge current output value and the ambient temperature of the battery to compute the final quantity of electricity. On the other hand, when the operation mode is decided to be the stand-by mode, it is preferable to compute the quantity of electricity by selecting suitable temperature data meeting the detected temperature from among those data prepared beforehand for each of the individual ambient temperatures and representing both the self-discharge quantity of electricity of the secondary battery and the quantity of electricity consumed by the battery residual capacity displaying system.

Such an arrangement is advantageous in that the residual capacity of the battery can be updated to an accurate newest capacity value by integrating the quantity of electricity discharged from the battery from its completely charged condition to the time of first detection of the voltage drop signal without recharging, and by storing this integrated value in the capacity memory section as the newest capacity value.

A modification of the residual capacity displaying system according to the present invention further comprises a residual capacity alarm section which receives the terminal voltage of the secondary battery and the discharge current output signal of the charging and discharge current detection section as its inputs and correcting to lower the battery voltage detection level in proportion to an increase in the discharge current, thereby generating an alarm signal irrespective of the value of the discharge current when a predetermined setting of the residual capacity of the secondary battery is reached. When the alarm signal is first generated from the residual capacity alarm section after the battery is charged, the capacity memory section stores a value obtained by dividing the value of the quantity of electricity integrated by the discharged electrical quantity integration section by a factor determined by a predetermined residual capacity alarm level of the residual capacity alarm section (which factor is 1−0.1 =0.9 when the predetermined residual capacity level is 10%), and the resultant value is stored as a newest battery capacity in the capacity memory section.

When the battery voltage drop detection level in the residual capacity alarm section is set at a value (a residual capacity of about 10% to 30%) sufficiently higher than an operation halting voltage of a portable electrical apparatus, the frequency of updating the stored capacity value under the actually operating condition of the portable electrical apparatus can be increased. However, even when the battery voltage drop detection level is merely raised, the desired accurate capacity value cannot be stored in the capacity memory section due to the fact that the residual capacity at the time of battery voltage drop detection differs depending on the level of the discharge current. This is because the value of the residual capacity at the time of battery voltage drop detection is large when the value of the discharge current is large, while the value of the residual capacity at the time of battery voltage drop detection is small when the value of the discharge current is small. Therefore, the correction to lower the battery voltage drop detection level in proportion to an increase in the value of the discharge current is made so as to generate the alarm signal when the value of the residual capacity reaches the predetermined level. In addition, the integrated value of the discharged quantity of electricity when the battery discharges the current from the time of completion of charging to the time of first detection of the alarm signal without being charged in the course of the discharge is divided by the factor determined on the basis of the value of the residual capacity at the time of detection of the alarm signal (which factor is, for example, 1−0.1=0.9 when the residual capacity value is 10%) to find the newest capacity value, so that the accurate newest capacity value can be updated with a high frequency.

Another modification of the residual capacity displaying system according to the present invention further comprises, in addition to the capacity memory section storing the newest battery capacity, a capacity rating memory section for storing the rated capacity of the secondary battery, a capacity comparison section receiving the capacity value stored in the capacity memory section and the capacity value stored in the rating memory section as its inputs to determine the degree of battery deterioration on the basis of the ratio of the capacity value stored in the capacity memory section to the capacity value stored in the rating memory section, and a display section displaying stepwise the degree of battery deterioration determined by the capacity comparison section.

DESCRIPTION OF THE PREFERRED EMBODIMENTS

Preferred embodiments of the battery residual capacity displaying system according to the present invention will now be described by reference to the drawings.

Figure 1:
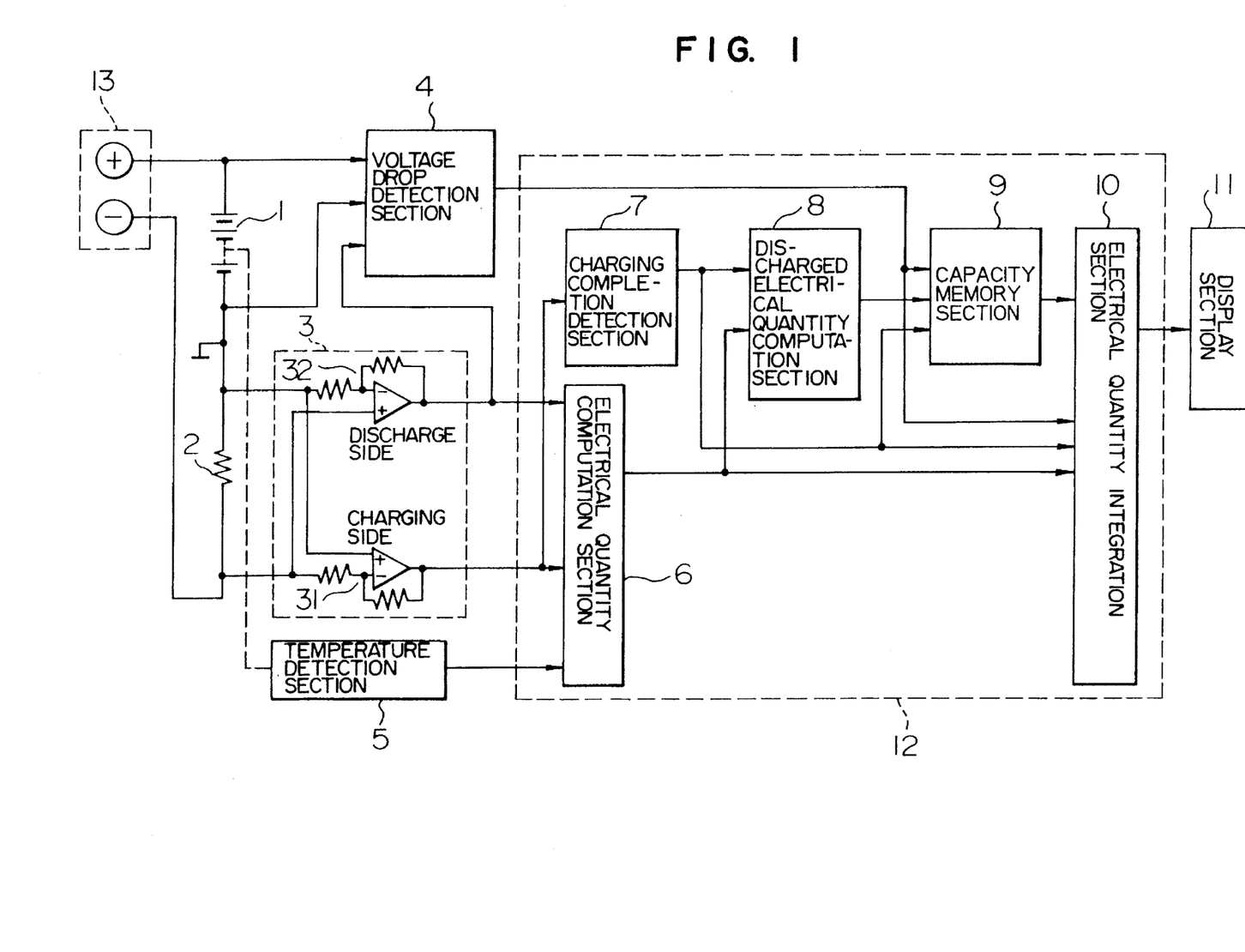
FIG. 1 is a block diagram showing the structure of an embodiment of the battery residual capacity displaying system according to the present invention.

FIG. 1 is a block diagram showing the structure of an embodiment of the battery residual capacity displaying system according to the present invention, and in FIG. 1, like reference numerals are used to designate like parts appearing in FIG. 7. In FIG. 1, the reference numeral 1 designates a secondary battery. A current detection resistor 2 is connected at one end to the negative electrode of the secondary battery 1. A charging and discharge current detection section 3 is composed of a charging current detection operational amplifier 31 and a discharge current detection operational amplifier 32 to each of which a very small voltage appearing across the current detection resistor 2 is applied as an input.

A voltage drop detection section 4 receives the terminal voltage of the secondary battery 1 as its input. A temperature detection section 5 detects the ambient temperature of the secondary battery 1. An electrical quantity computation section 6 receives the output signals of the operational amplifiers 31, 32 and the output signal of the temperature detection section 5 as its inputs. A charging completion detection section 7 receives the output signal of the operational amplifier 31 as its input. A discharged electrical quantity integration section 8 receives the output signal of the electrical quantity computation section 6 and the output signal of the charging completion detection section 7 as its inputs. A capacity memory section 9 receives the output signal of the voltage drop detection section 4, the output signal of the charging completion detection section 7 and the output signal of the discharged electrical quantity integration section 8 as its inputs. An electrical quantity integration section 10 receives the output signal of the electrical quantity computation section 6, the output signal of the capacity memory section 9, the output signal of the voltage drop detection section 4 and the output signal of the charging completion detection section 7 as its inputs. A display section 11 receives the output signal of the electrical quantity integration section 10 as its input. A one-chip microcomputer 12 constitutes the circuitry corresponding to those of the electrical quantity computation section 6, charging completion detection section 7, discharged electrical quantity integration section 8, capacity memory section 9 and electrical quantity integration section 10. The reference numeral 13 designates a terminal across which a portable electrical apparatus or a battery charger is connected.

The operation of the battery residual capacity displaying system of the present invention having the aforementioned structure will now be described. The operation of the residual capacity displaying system in the charging mode will be first described by reference to FIG. 1. When the charger is connected across the terminal 13 to start charging the secondary battery 1, a negative very small voltage (when the level of the negative electrode of the secondary battery 1 is set at a zero potential level) proportional to the charging current appears across the current detection resistor 2. This very small voltage is amplified up to a positive value by the function of the operational amplifier 31, and such an output signal of the operational amplifier 31 is applied to both the electrical quantity computation section 6 and the charging completion detection section 7 as inputs. The electrical quantity computation section 6 computes the quantity of electricity by multiplying the charging current value outputted from the operational amplifier 31 by a predetermined period. Further, in the electrical quantity computation section 6, the computed electrical quantity is then multiplied by the charging efficiency determined by both the level of the charging current and the temperature information supplied from the temperature detection section 5, thereby computing the finally charged quantity of electricity and applying such an output signal as an input to the electrical quantity integration section 10. In response to the application of the charging current signal from the operational amplifier 31, the charging completion detection section 7 resets its output signal. Then, when the charging current value changes from that of quick charging to that of trickle charging as the charging proceeds, the charging completion detection section 7 recognizes the end of the charging operation and sets its output signal. In the electrical quantity integration section 10, the charged electrical quantity signals successively outputted from the electrical quantity computation section 6 are added at time intervals of the predetermined period thereby integrating the quantity of electricity. Thus, the ratio of the integrated value of the quantity of electricity to the capacity value stored in the capacity memory section 9 determines the residual capacity of the secondary battery 1. When the output signal of the charging completion detection section 7 is in the set state, the integrated value of the quantity of electricity is set at the value corresponding to the residual capacity of 100%. On the basis of the residual capacity information determined by the electrical quantity integration section 10, the display section 11 displays the residual capacity stepwise on an LCD display as shown in FIG. 3A. As the secondary battery 1 is progressively charged, the residual capacity display shifts successively in the order of from a display level (1) towards a display level (6) as shown.

The operation of the residual capacity displaying system in the discharge mode will next be described. When a portable electrical apparatus to be used is connected across the terminal 13, the current is supplied from the secondary battery 1, and the discharge is started. As a result, a positive very small voltage (when the level of the negative electrode of the secondary battery 1 is set at a zero potential level) proportional to the discharge current appears across the current detection resistor 2. This very small voltage is amplified by the operational amplifier 32, and the amplifier output signal is applied as an input to the electrical quantity computation section 6. The electrical quantity computation section 6 computes the quantity of electricity by multiplying the discharge current value outputted from the operational amplifier 32 by a predetermined period. Further, in the electrical quantity computation section 6, the computed quantity of electricity is multiplied by the discharge efficiency determined by both the level of the discharge current and the temperature information supplied from the temperature detection section 5, thereby computing the finally discharged quantity of electricity and applying such an output signal as an input to both the discharged electrical quantity integration section 8 and the electrical quantity integration section 10. The discharged electrical quantity integration section 8 integrates the discharged quantity of electricity at time intervals of the predetermined period only when the output signal of the charging completion detection section 7 is in the set state and the output signal of the electrical quantity computation section 6 indicates the discharge. On the other hand, when the output signal of the charging completion detection section 7 is in the reset state, the integration of the discharged quantity of electricity is nullified irrespective of the output of the electrical quantity computation section 6. The voltage drop detection section 4 is basically in the form of a voltage comparator so as to check the voltage drop of the secondary battery 1, and its voltage detection level is selected to be higher than the operation halting voltage level of the portable electrical apparatus. The capacity memory section 9 stores the value of the quantity of electricity integrated by the discharged electrical quantity integration section 8 as a newest battery capacity when the output signal of the charging completion detection section 7 is in the set state and the voltage drop signal is first outputted from the voltage drop detection section 4 after the secondary battery 1 is charged. In the electrical quantity integration section 10, the discharged electrical quantity signals successively outputted from the electrical quantity computation section 6 are subtracted at time intervals of the predetermined period thereby integrating the quantity of electricity. On the basis of the ratio of this integrated value of the quantity of electricity to the value stored in the capacity memory section 9, the value of the residual capacity is determined. When the voltage drop signal is outputted from the voltage drop detection section 4, the integrated value of the quantity of electricity is nullified. The display section 11 displays stepwise, on the LCD display shown in FIG. 3A, the residual capacity on the basis of the residual capacity information determined by the electrical quantity integration section 10, and its display successively shifts from the display level (6) towards the display level (1) shown in FIG. 3A as the discharge proceeds.

Figure 2:
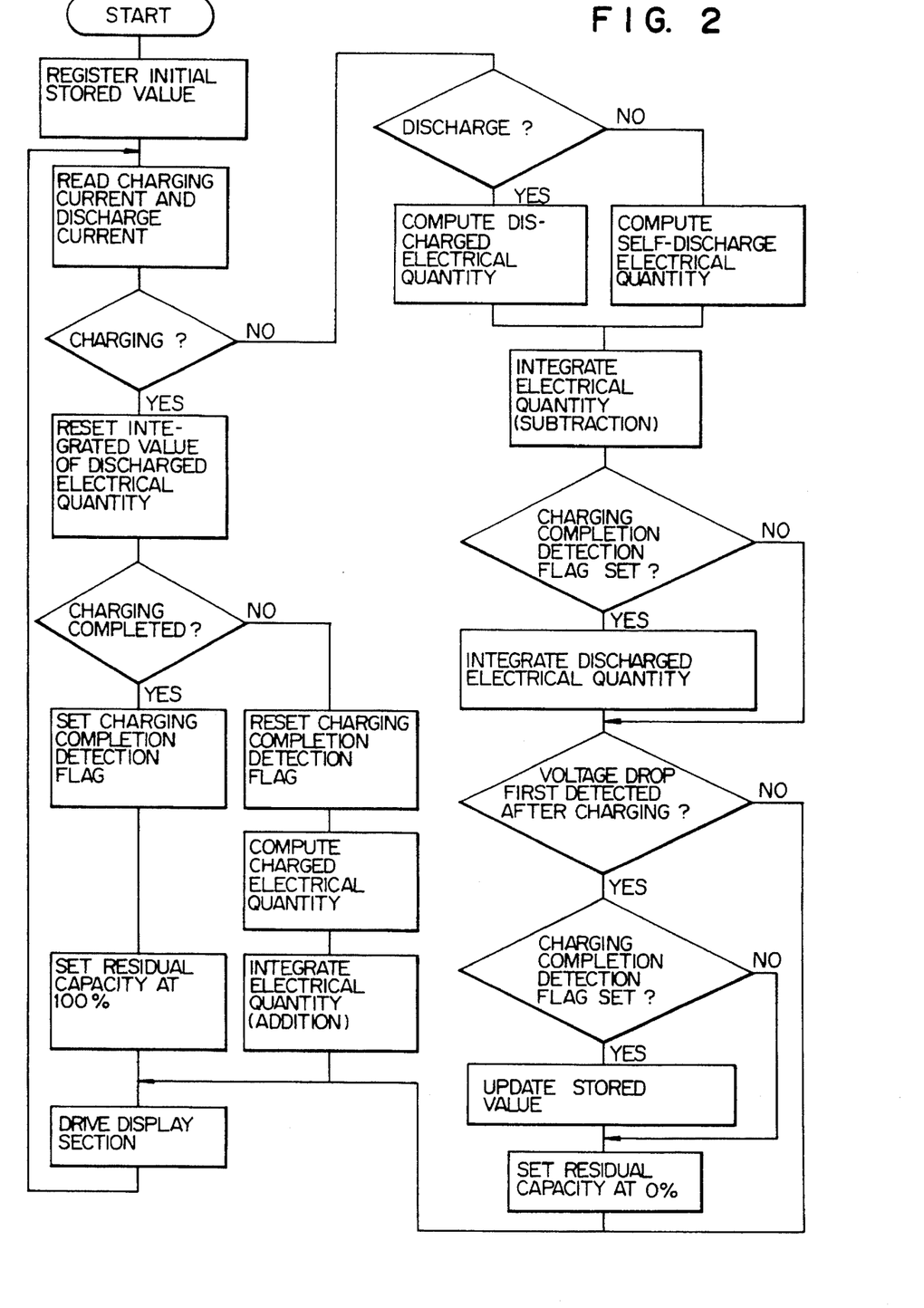
FIG. 2 is a flow chart of the operation controlled by the microcomputer in the embodiment shown in FIG. 1.

The operation of the residual capacity displaying system in the stand-by mode will be finally described. In the stand-by mode, neither the charging current nor the discharge current is flowing, and no output signals appear from both the operational amplifiers 31 and 32. Therefore, the stand-by mode is recognized when the electrical quantity computation section 6 detects that no output signals are generated from the operational amplifiers 31 and 32. The electrical quantity computation section 6 determines the quantity of electricity discharged in the stand-by mode on the basis of the self-discharge electrical quantity of the secondary battery 1 measured beforehand for each of individual ambient temperatures, the information regarding the electrical quantity consumption of the battery residual capacity displaying system and the temperature information supplied by the output signal of the temperature detection section 5. The later operation is the same as that in the discharge mode described already, so that any detailed description will be unnecessary. FIG. 2 is a flow chart of control by the one-chip microcomputer 12 when the circuits of the electrical quantity computation section 6, the charging completion detection section 7, the discharged electrical quantity integration section 8, the capacity memory section 9 and the electrical quantity integration section 10 in the embodiment of the present invention are constituted by the one-chip microcomputer 12. The operation in each of the individual steps shown in FIG. 2 is basically the same as that described already, and any detailed description will be unnecessary.

Figure 3B:
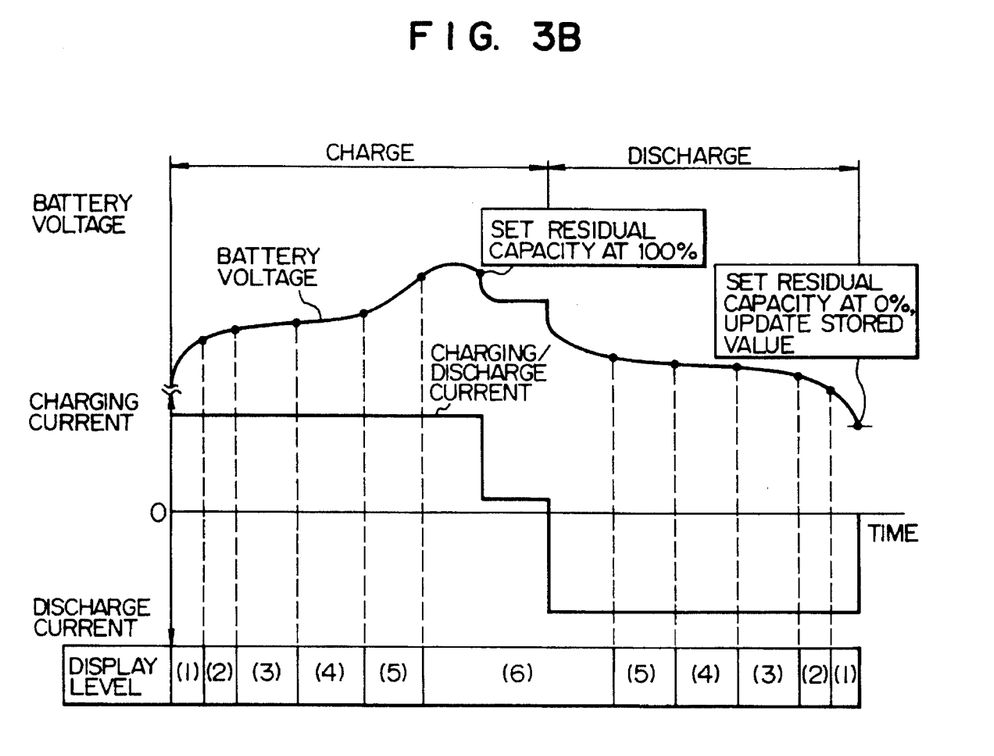
FIG. 3B shows the relation between the battery voltage in the charging and discharge modes and the charging and discharge currents and shows also the relation between the charging and discharge currents and the display level.

FIG. 3B shows the relation between the battery voltage in the charging and discharge modes and the charging and discharge currents and shows also the relation between the charge-discharge and the display level. As the charging proceeds, the display successively shifts from the display level (1) towards the display level (6), and, when the secondary battery 1 is completely charged, the value of the residual capacity is set at 100%. On the other hand, as the discharge proceeds, the display successively shifts from the display level (6) towards the display level (1), and, in response to the appearance of the voltage drop detection signal, the value of the residual capacity is set at 0%.

It will be seen from the above description of the embodiment of the present invention that the discharged electrical quantity integration section 8 successively integrates the quantity of electricity when the secondary battery 1 discharges from its full charged condition without being recharged during the discharge, and the capacity memory section 9 stores the integrated value of the quantity of electricity as the newest battery capacity only when the voltage drop signal is first outputted from the voltage drop detection section 4 after the battery 1 discharges from its full charged condition without being recharged. On the other hand, when the battery 1 is recharged while the battery 1 is discharging from its full charged condition, the discharged electrical quantity integration section 8 does not integrate the quantity of electricity, and the capacity memory section 9 does not store the integrated value as the battery capacity. Therefore, after the residual capacity is updated, the value stored in the capacity memory section 9 is accurate, so that the precision of residual capacity display can be improved.

Figure 4:
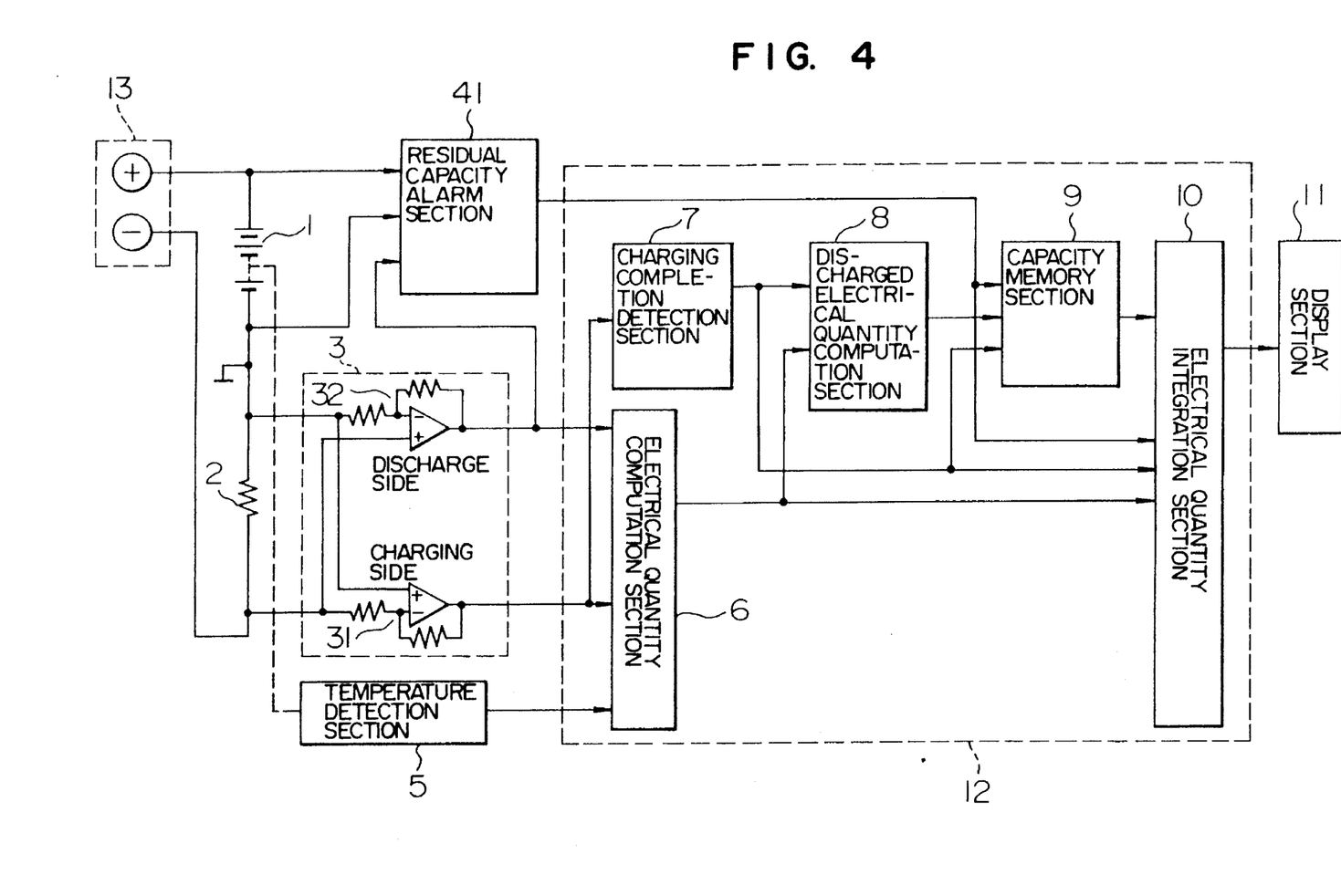
FIG. 4 is a block diagram showing the structure of another embodiment of the present invention.

FIG. 4 is a block diagram showing the structure of a modification of the embodiment of the battery residual capacity displaying system according to the present invention. Referring to FIG. 4, the voltage drop detection section 4 is replaced by a residual capacity alarm section 41 as shown. This residual capacity alarm section 41 receives the terminal voltage of the secondary battery 1 and the output signal of the discharge side operational amplifier 32 in the charging and discharge current detection section 3 as its inputs.

This residual capacity alarm section 41 has the function of checking the voltage drop of the secondary battery 1 as the discharge proceeds and outputting an alarm signal when the residual capacity of the battery 1 drops to the level of 10%. When the output signal of the charging completion detection section 7 is in the set state, and the alarm signal is first outputted from the residual capacity alarm section 41 after the battery 1 is charged, the value obtained by dividing the value of the quantity of electricity integrated in the discharged electrical quantity integration section 8 by the factor of 0.9 is stored in the capacity memory section 9 as a newest battery capacity. This means that, because the residual capacity of the battery 1 at the time of alarm signal detection is 10%, the quantity of electricity discharged from the battery 1 from its full charged condition to the time of alarm signal detection without recharging corresponds to 90% of the full capacity, and the value obtained by dividing the integrated value of the quantity of electricity in the discharged electrical quantity integration section 8 by the factor of (1−0.1 =0.9) is stored as the newest capacity in the capacity memory section 9. In the electrical quantity integration section 10, the discharged electrical quantity signals outputted from the electrical quantity computation section 6 are subtracted at time intervals of the predetermined period thereby integrating the quantity of electricity. Then, the value of the residual capacity is determined on the basis of the ratio of the integrated value of the quantity of electricity to the value stored in the capacity memory section 9, and the integrated value of the quantity of electricity is set at the value corresponding to the residual capacity value of 10% when the alarm signal is outputted from the residual capacity alarm section 41.

Figure 5:
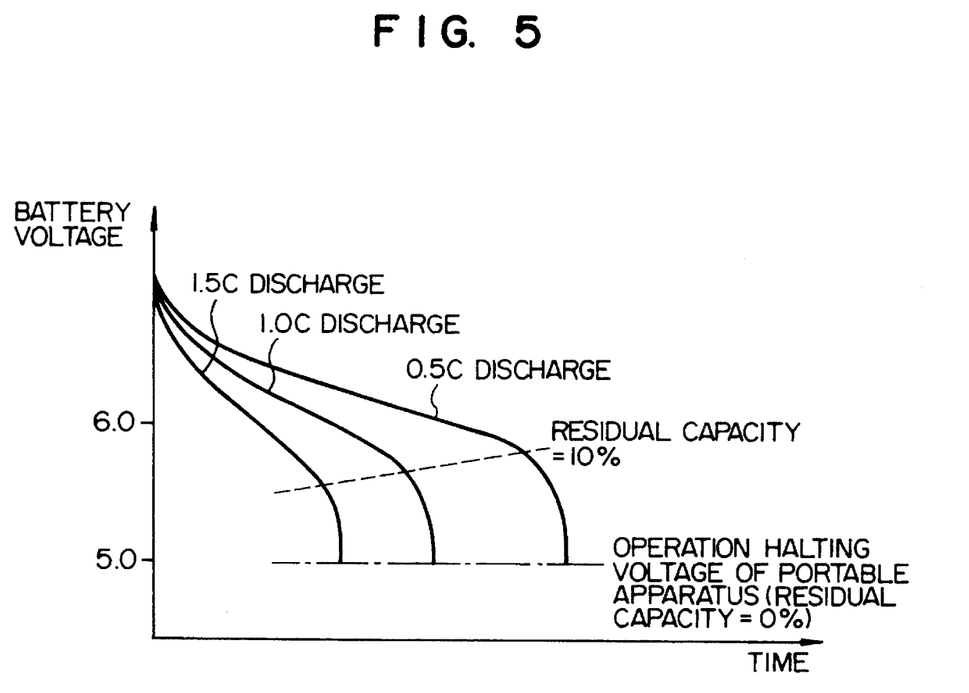
FIG. 5 shows the relation between the battery voltage classified by the value of the discharge current and the residual capacity.

FIG. 5 shows the relation between the battery voltage and the residual capacity of the battery 1 when classified according to the value of the discharge current. It will be seen that the larger the value of the discharge current, the battery voltage becomes quickly lower, and the gradient of the battery voltage drop curve is steeper. When the battery voltage at the residual capacity of 10% is noted, the battery voltage drops in proportion to the level of the discharge current. Therefore, by means of correction for lowering the voltage detection level of the residual capacity alarm section 41 in proportion to the level of the discharge current, the alarm signal can be outputted in response to attainment of a predetermined residual capacity, for example, about 10% to 30% of the battery capacity irrespective of the level of the discharge current of the battery 1.

According to the modification of the embodiment of the present invention, the frequency of generation of the alarm signal from the residual capacity alarm section 41 under actual operation can be increased when the residual capacity alarm section 41 is designed to output the alarm signal when a residual capacity setting of 10% is reached. When the integrated value of the discharged quantity of electricity is divided by the factor of 0.9 during the discharge of the battery 1 from its full charged condition to the time of first generation of the alarm signal without being recharged, the accurate newest battery capacity can be stored in the capacity memory section 9. As a result, the accurate newest battery capacity can be updated with a high frequency in the capacity memory section 9.

Figure 6:
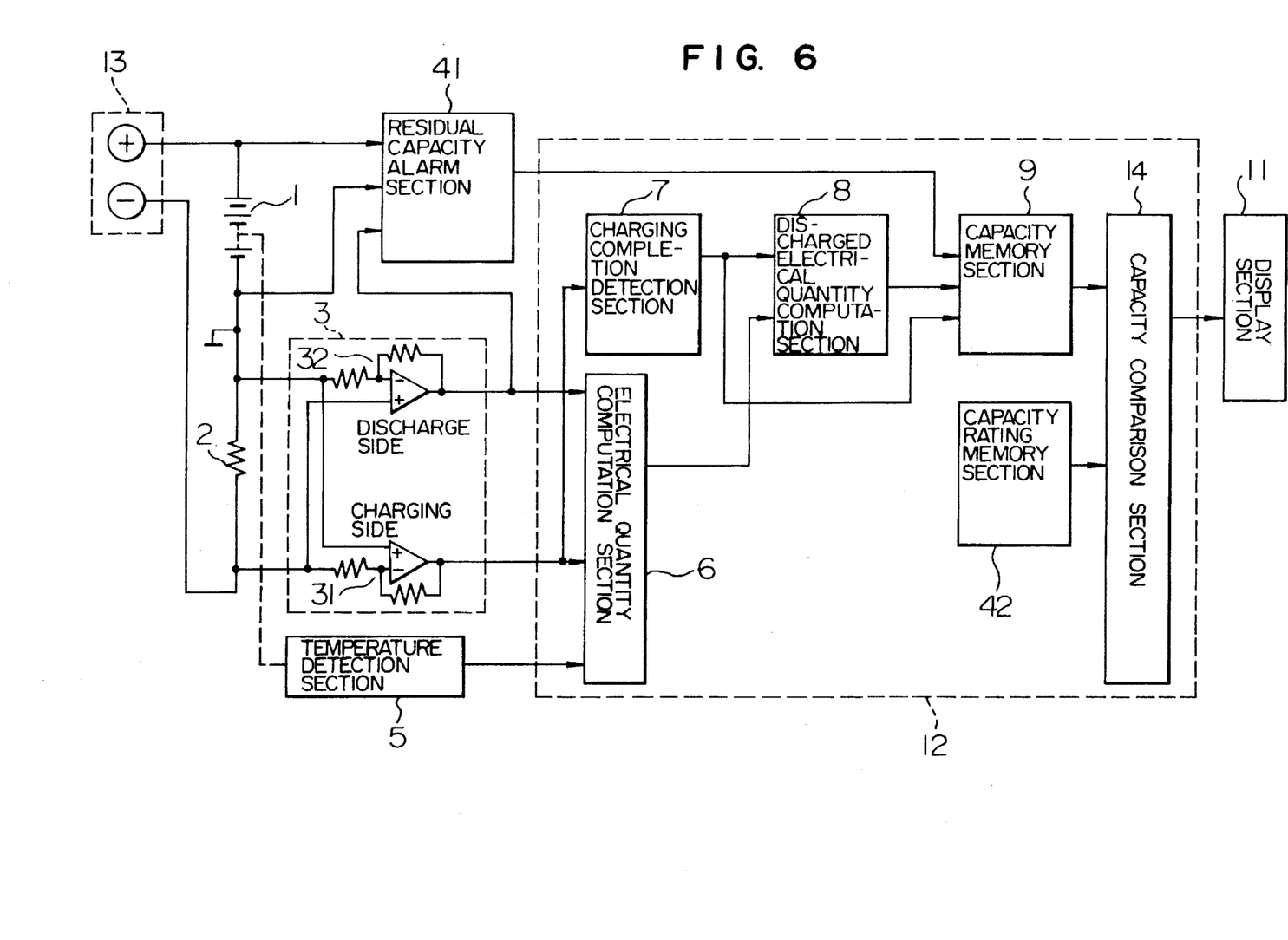
FIG. 6 is a block diagram showing the structure of still another embodiment of the present invention.

FIG. 6 is a block diagram showing the structure of still another modification of the embodiment of the present invention. Referring to FIG. 6, the reference numeral 42 designates a capacity rating memory section that stores the value of the rated capacity of the secondary battery 1. A capacity comparison section 14 receives the output signal of the capacity memory section 9 and the output signal of the capacity rating memory section 42 as its inputs. The display section 11 receives the output signal of the capacity comparison section 14. The electrical quantity computation section 6, the charging completion detection section 7, the discharged electrical quantity integration section 8, the capacity memory section 9, the capacity comparison section 14 and the capacity rating memory section 42 are built in the one-chip microcomputer 12.

The capacity comparison section 14 determines the degree of deterioration of the battery 1 on the basis of the ratio of the capacity value stored in the capacity memory section 9 to the capacity value stored in the capacity rating memory section 42. On the basis of the battery deterioration information determined by the capacity comparison section 14, the display section 11 displays stepwise the degree of battery deterioration on the five segments of the LCD display as described already by reference to FIG. 3A. As the degree of battery deterioration progressively becomes larger, the display successively shifts from the display level (6) towards the display level (1) shown in FIG. 3A.

In the modification of the embodiment of the present invention shown in FIG. 6, the capacity rating memory section 42 stores the value of the rated capacity of the secondary battery 1. However, the value stored in the capacity rating memory section 42 may be that representing the actual capacity before the battery 1 is deteriorated. That is, the stored value may be the value of the initial capacity of the secondary battery 1 which is subjected to charging and discharge at the time of delivery from the factory and which can be registered in a memory such as a PROM. In this case, the determination of the degree of battery deterioration is based on the actual initial capacity of the battery 1. Thus, the difference between the degree of battery deterioration displayed on the LCD display and the degree of battery deterioration under the actual use can be sensed less than that sensed when the rated capacity is taken as the basis.

It will be seen from the above description of the embodiment of the present invention shown in FIG. 6 that the voltage detection level of the residual capacity alarm section 41, that can generate the alarm signal at the time of attainment of the predetermined value of the residual capacity of the battery 1 irrespective of the value of the discharge current, is set at the value which has a sufficient margin with respect to the operation halting voltage of a portable electrical apparatus, that is, at about 10% to 30% of the full capacity of the battery 1. Therefore, the frequency of generation of the alarm signal under the actual operating condition of the battery 1 can be increased. Further, the accurate newest capacity stored in the capacity memory section 9 can be determined by dividing the integrated value of the quantity of electricity, when the battery 1 discharges from its full charged condition to the time of generation of the alarm signal without being recharged during the discharge, by the factor determined on the basis of the value of the residual capacity of the battery 1 at the time of generation of the alarm signal from the residual capacity alarm section 41. Therefore, the accurate newest capacity of the battery 1 can be updated with a high frequency, so that the residual capacity of the battery 1 can be displayed with high precision by the battery deterioration displaying system according to the present invention.

I claim:

1. A system for displaying a residual capacity of a secondary battery, said system comprising:

a current detection resistor for converting a charging current and a discharge current of said secondary battery into very small voltages respectively;

charging and discharging current detection means, comprising a charging side operational amplifier and a discharge side operational amplifier, for amplifying the very small voltages appearing across said current detection resistor respectively to generate resultant signals and outputting the resultant signals respectively;

voltage drop detection means for detecting a situation where a voltage of said secondary battery has dropped to a level lower than a predetermined setting and outputting a voltage drop signal when said situation is detected;

temperature detection means for detecting an ambient temperature of said secondary battery to generate a temperature signal and outputting the temperature signal;

electrical quantity computation means, receiving the resultant signals of said charging and discharge current detection means together with the temperature signal of said temperature detection means as its inputs, for deciding whether an operation mode of said system is a charging mode, a discharge mode or a stand-by mode and computing a quantity of electricity in that mode;

charging completion detection means for producing an output signal and setting its output signal when completion of charging said secondary battery is detected, but resetting its output signal when charging said secondary battery is started;

discharged electrical quantity integration means for integrating the quantity of electricity at time intervals of a predetermined period to derive a first integrated value when the output signal of said charging completion detection means is set and a decision of said electrical quantity computation means indicates the discharge mode, but, when the output signal of said charging completion detection means is reset, nullifying the first integrated value irrespective of the decision of said electrical quantity computation means;

capacity memory means for storing the first integrated value integrated by said discharged electrical quantity integration means as a newest battery capacity when the output signal of said charging completion detection means is set and the voltage drop signal is first outputted from said voltage drop detection means after the charging is started;

electrical quantity integration means for obtaining a second integrated value by integrating, at time intervals of the predetermined period, the quantity of electricity by addition when the decision of said electrical quantity computation means indicates the charging mode, but by subtraction when the decision of said electrical quantity computation means indicates the discharge mode, thereby determining the residual capacity on the basis of a ratio of the second integrated value to the first integrated value stored in said capacity memory means, said electrical quantity integration means setting the second integrated value to correspond to the value of the residual capacity at the predetermined voltage level when the voltage drop signal is first outputted from said voltage drop detection means after the charging is started, but setting the second integrated value to correspond to the residual capacity of 100% when the output signal of said charging completion detection means is set as a result of the charging; and display means for displaying the residual capacity stepwise on the basis of the value of the residual capacity determined by said electrical quantity integration means.

2. A battery residual capacity displaying system according to claim 1, wherein said electrical quantity computation means multiplies, when the detected mode is one of the charging mode and the discharge mode, one of the resultant signals by a predetermined period to compute the quantity of electricity and then multiplies the quantity of electricity by an efficiency determined by both the one of the resultant signals and the ambient temperature of said secondary battery to compute the final quantity of electricity, while when the detected mode is the stand-by mode, the electrical quantity computation means computes the quantity of electricity by selecting suitable temperature data meeting the detected temperature from among a plurality of temperature data prepared beforehand for each of a plurality of ambient temperatures and representing both a self-discharge quantity of electricity of said secondary battery and a quantity of electricity consumption by said battery residual capacity displaying system.

3. A battery residual capacity displaying system according to claim 1, wherein said display means comprises a display unit including a plurality of liquid crystal display segments energized or deenergized in response to application of an input signal.

4. A system for displaying a residual capacity of a secondary battery, said system comprising:

a current detection resistor for converting a charging current and a discharge current of said secondary battery into very small voltages respectively;

charging and discharge current detection means, comprising a charging side operational amplifier and a discharge side operational amplifier, for amplifying the very small voltages appearing across said current detection resistor respectively to generate resultant signals and outputting the resultant signals respectively;

residual capacity alarm means, receiving a terminal voltage of said secondary battery and one of the resultant signals corresponding to the discharge current as its inputs, for lowering battery voltage detection level in proportion to an increase in the discharge current and for generating an alarm signal irrespective of the discharge current when a predetermined setting of the residual capacity of said secondary battery is reached;

temperature detection means for detecting the ambient temperature of said secondary battery to produce a temperature signal and outputting the temperature signal;

electrical quantity computation means, receiving the resultant signals together with the temperature signal, for deciding whether an operation mode of the system is a charging mode, a discharge mode or a stand-by mode and computing a quantity of electricity in that mode;

charging completion detection means for producing an output signal and setting its output signal when completion of charging said secondary battery is detected, but resetting its output signal when charging said secondary battery is started;

discharged electrical quantity integration means for integrating the quantity of electricity at time intervals of a predetermined period to derive a first integrated value when the output signal of said charging completion detection means is set and a decision of said electrical quantity computation means indicates the discharge mode, but, when the output signal of said charging completion detection means is reset, nullifying the first integrated value irrespective of the decision of said electrical quantity computation means;

capacity memory means for storing a value obtained by dividing the first integrated value by a factor determined by a predetermined residual capacity alarm level of said residual capacity alarm means, which factor is 1−0.1 =0.9 when said predetermined setting of the residual capacity alarm level is 10%, as a newest battery capacity when the output signal of said charging completion detection means is set and the alarm signal is first generated from said residual capacity alarm means after the charging is started;

electrical quantity integration means for obtaining a second integrated value by integrating, at time intervals of the predetermined period, the quantity of electricity by addition when the decision of said electrical quantity computation means indicates the charging mode, but by subtraction when the decision of said electrical quantity computation means indicates the discharge mode, thereby determining the residual capacity on the basis of a ratio of the second integrated value to the first integrated value stored in said capacity memory means, said electrical quantity integration means setting the second integrated value to correspond to the value of the predetermined residual capacity when the alarm signal is first generated from said residual capacity alarm means after the charging is started, but setting the second integrated value to correspond to the residual capacity of 100% when the output signal of said charging completion detection means is set as a result of the charging; and display means for displaying stepwise the residual capacity on the basis of the value of the residual capacity determined by said electrical quantity integration means.

5. A battery residual capacity displaying system according to claim 4, wherein said electrical quantity computation means multiplies, when the detected mode is one of the charging mode and the discharge mode, one of the resultant signals by a predetermined period to compute the quantity of electricity and then multiplies the quantity of electricity by an efficiency determined by both the one of the resultant signals and the ambient temperature of said secondary battery to compute the final quantity of electricity, while when the detected mode is the stand-by mode, the electrical quantity computation means computes the quantity of electricity by selecting suitable temperature data meeting the detected temperature from among a plurality of temperature data prepared beforehand for each of a plurality of ambient temperatures and representing both a self-discharge quantity of electricity of said secondary battery and a quantity of electricity consumption by said battery residual capacity displaying system.

6. A system for displaying a residual capacity of a secondary battery, said system comprising:

a current detection resistor for converting a charging current and a discharge current of said secondary battery into very small voltages respectively;

charging and discharge current detection means, comprising a charging side operational amplifier and a discharge side operational amplifier, for amplifying the very small voltages appearing across said current detection resistor respectively to generate resultant signals and outputting the resultant signals respectively;

residual capacity alarm means, receiving a terminal voltage of said secondary battery and one of the resultant signals corresponding to the discharge current as its inputs, for lowering battery voltage detection level in proportion to an increase in the discharge current and for generating an alarm signal irrespective of the discharge current when a predetermined setting of the residual capacity of said secondary battery is reached;

temperature detection means for detecting the ambient temperature of said secondary battery to produce a temperature signal and outputting the temperature signal;

electrical quantity computation means, receiving the resultant signal together with the temperature signal, for deciding whether an operation mode of the system is a charging mode, a discharge mode or a stand-by mode, and, when the detected mode is the discharge mode, multiplying one of the resultant signals corresponding to the discharge current by a predetermined period to compute a discharged quantity of electricity and then multiplying the discharged quantity of electricity by a discharge efficiency determined by both said one of the resultant signals and the ambient temperature of said secondary battery to compute a final quantity of electricity, while when the detected mode is the stand-by mode, computing a quantity of electricity by selecting suitable temperature data meeting the ambient temperature from among a plurality of data prepared beforehand for each of a plurality of ambient temperatures and representing both a self-discharge quantity of electricity of said secondary battery and a quantity of electrical consumption by said battery residual capacity displaying system;

charging completion detection means for producing an output signal and setting its output signal when completion of charging said secondary battery is detected, but resetting its output signal when charging said secondary battery is started;

discharged electrical quantity integration means for integrating the discharged quantity of electricity to obtain a first integrated value at time intervals of said predetermined period when the output signal of said charging completion detection means is in the set state, but nullifying the first integrated value when the output signal of said charging completion detection means is in the reset state;

capacity memory means for storing a value obtained by dividing the first integrated value by a factor determined by a predetermined residual capacity alarm level of said residual capacity alarm means, which factor is 1−0.1 =0.9 when said predetermined residual capacity alarm level is 10%, as a newest battery capacity when the output signal of said charging completion detection means is set and the alarm signal is first generated from said residual capacity alarm means after the charging is started;

capacity rating memory means for storing a rated capacity of said secondary battery;

capacity comparison means, receiving the value stored in said capacity memory means and the rated capacity stored in said capacity rating memory means for determining a degree of battery deterioration on the basis of a ratio of the value stored in said capacity memory means to the rated capacity; and display means for displaying stepwise the degree of battery deterioration determined by said capacity comparison means.

7. A battery residual capacity displaying system according to claim 6, wherein the rated capacity stored in said capacity rating memory means is an initial capacity value of said secondary battery.

\* \* \* \* \*

UNITED STATES PATENT AND TRADEMARK OFFICE
CERTIFICATE OF CORRECTION

PATENT NO.  : 5,545,969

DATED       : August 13, 1996

INVENTOR(S) : Hirokazu HASEGAWA

It is certified that error appears in the above-identified patent and that said Letters Patent is hereby corrected as shown below:

On the title page, item:

[30] Foreign Application Priority Data, should read--

```
December 2, 1992   [JP]   Japan....................4-322968
December 2, 1992   [JP]   Japan....................4-322969
December 2, 1992   [JP]   Japan....................4-322970
```
--.

Signed and Sealed this

Eighteenth Day of February, 1997

Attest:

BRUCE LEHMAN

*Attesting Officer*     *Commissioner of Patents and Trademarks*